(12) United States Patent
Iwata et al.

(10) Patent No.: US 10,290,511 B2
(45) Date of Patent: May 14, 2019

(54) SUBSTRATE TREATMENT APPARATUS AND SUBSTRATE TREATMENT METHOD

(71) Applicant: SCREEN Holdings Co., Ltd., Kyoto (JP)

(72) Inventors: Keiji Iwata, Kyoto (JP); Hiroki Tsujikawa, Kyoto (JP); Shotaro Tsuda, Kyoto (JP); Seiji Ano, Kyoto (JP)

(73) Assignee: SCREEN Holdings Co., Ltd (JP)

( * ) Notice: Subject to any disclaimer, the term of this patent is extended or adjusted under 35 U.S.C. 154(b) by 5 days.

(21) Appl. No.: 15/433,538

(22) Filed: Feb. 15, 2017

(65) Prior Publication Data

US 2017/0162400 A1 Jun. 8, 2017

Related U.S. Application Data

(62) Division of application No. 13/954,188, filed on Jul. 30, 2013, now abandoned.

(30) Foreign Application Priority Data

Aug. 8, 2012 (JP) .................................. 2012-176233

(51) Int. Cl.
*H01L 21/311* (2006.01)
*H01L 21/02* (2006.01)
*H01L 21/67* (2006.01)
*B08B 3/08* (2006.01)
*B08B 3/10* (2006.01)
(Continued)

(52) U.S. Cl.
CPC ........ *H01L 21/31133* (2013.01); *B08B 3/041* (2013.01); *B08B 3/08* (2013.01); *B08B 3/10* (2013.01); *C11D 7/08* (2013.01); *C11D 11/0047* (2013.01); *G03F 7/423* (2013.01); *H01L 21/02057* (2013.01); *H01L 21/30604* (2013.01); *H01L 21/6708* (2013.01); *H01L 21/67051* (2013.01); *B08B 2203/005* (2013.01); *B08B 2203/007* (2013.01)

(58) Field of Classification Search
None
See application file for complete search history.

(56) References Cited

U.S. PATENT DOCUMENTS 5,158,100 A 10/1992 Tanaka .......................... 134/105
6,032,682 A * 3/2000 Verhaverbeke ........... B08B 3/08
134/1.3
(Continued)

FOREIGN PATENT DOCUMENTS

JP 2000-331978 A 11/2000
JP 2001-330969 11/2001
(Continued)

*Primary Examiner* — Allan W. Olsen
(74) *Attorney, Agent, or Firm* — Ostrolenk Faber LLP

(57) ABSTRACT

A substrate treatment method is used for removing a resist from a front surface of a substrate. A substrate treatment apparatus includes a substrate holding unit which holds the substrate, and a sulfuric acid ozone/water mixture supplying unit which supplies a sulfuric acid ozone/water mixture to the front surface of the substrate held by the substrate holding unit, the sulfuric acid ozone/water mixture being a mixture which is prepared by a method including mixing water with sulfuric acid ozone prepared by dissolving ozone gas in sulfuric acid.

5 Claims, 4 Drawing Sheets

(51) Int. Cl.
*C11D 11/00* (2006.01)
*C11D 7/08* (2006.01)
*G03F 7/42* (2006.01)
*H01L 21/306* (2006.01)
*B08B 3/04* (2006.01)

(56) References Cited

U.S. PATENT DOCUMENTS

| | | | | |
|---|---|---|---|---|
| 6,240,933 | B1* | 6/2001 | Bergman | B08B 3/08 134/1.3 |
| 6,664,196 | B1 | 12/2003 | Wada et al. | 438/754 |
| 6,869,487 | B1* | 3/2005 | Bergman | B08B 3/00 134/102.1 |
| 6,955,758 | B2 | 10/2005 | Yamazaki et al. | 210/150 |
| 7,427,333 | B2 | 9/2008 | Wada | 156/345.11 |
| 8,038,799 | B2 | 10/2011 | Nagai et al. | 134/3 |
| 2002/0066717 | A1* | 6/2002 | Verhaverbeke | C02F 1/78 216/13 |
| 2004/0221880 | A1 | 11/2004 | Tomita et al. | 134/95.1 |
| 2004/0266205 | A1 | 12/2004 | Han et al. | 438/708 |
| 2005/0026435 | A1* | 2/2005 | Chen | G03F 7/428 438/689 |
| 2005/0176259 | A1 | 8/2005 | Yokoi et al. | 438/745 |
| 2007/0161248 | A1* | 7/2007 | Christenson | B08B 3/08 438/689 |
| 2007/0224792 | A1* | 9/2007 | Tomita | C09K 13/08 438/594 |
| 2007/0227556 | A1* | 10/2007 | Bergman | G03F 7/423 134/3 |
| 2007/0298619 | A1 | 12/2007 | Yokoi et al. | 438/745 |
| 2008/0006295 | A1 | 1/2008 | Miyazaki et al. | 134/3 |
| 2008/0196743 | A1 | 8/2008 | Shibata et al. | 134/3 |
| 2008/0280452 | A1 | 11/2008 | Yokoi et al. | 438/754 |
| 2008/0283090 | A1 | 11/2008 | DeKraker et al. | 134/3 |
| 2009/0065032 | A1 | 3/2009 | Han et al. | 134/61 |
| 2009/0281016 | A1* | 11/2009 | Cooper | G03F 7/423 510/176 |
| 2009/0291565 | A1 | 11/2009 | Yokoi et al. | 438/745 |
| 2009/0325390 | A1 | 12/2009 | Domon et al. | 438/758 |
| 2010/0175714 | A1 | 7/2010 | Nagai et al. | 134/3 |
| 2010/0326476 | A1* | 12/2010 | Rho | G03F 7/423 134/26 |
| 2011/0000874 | A1 | 1/2011 | Yokoi et al. | 216/12 |
| 2012/0138097 | A1* | 6/2012 | Okorn-Schmidt | H01L 21/67115 134/19 |
| 2013/0068260 | A1 | 3/2013 | Yamakawa et al. | 134/26 |
| 2013/0233343 | A1* | 9/2013 | Brown | H01L 21/6715 134/3 |
| 2014/0045339 | A1 | 2/2014 | Iwata et al. | 438/745 |
| 2014/0206195 | A1* | 7/2014 | Lauerhaas | H01L 21/6708 438/700 |

FOREIGN PATENT DOCUMENTS

| | | |
|---|---|---|
| JP | 2002-033300 | 1/2002 |
| JP | 2002-038282 | 2/2002 |
| JP | 2002-353196 | 12/2002 |
| JP | 2004-029696 | 1/2004 |
| JP | 2004-207514 | 7/2004 |
| JP | 2005-020011 | 1/2005 |
| JP | 2005-251807 | 9/2005 |
| JP | 2006-196478 | 7/2006 |
| JP | 2006-272170 | 10/2006 |
| JP | 2007-227813 | 9/2007 |
| JP | 2008-66464 A | 3/2008 |
| JP | 2008-198742 | 8/2008 |
| JP | 2008-198742 A | 8/2008 |
| JP | 2008-311591 | 12/2008 |
| JP | 2009-231466 A | 10/2009 |
| JP | 2010-021335 | 1/2010 |
| JP | 2010-034521 | 2/2010 |
| JP | 2010-140965 | 6/2010 |
| JP | 2010-283297 | 12/2010 |
| JP | 2011-014906 | 1/2011 |
| JP | 2011-066389 | 3/2011 |
| JP | 2011-192779 | 9/2011 |
| WO | WO 2005013002 A2 | 2/2005 |
| WO | WO 2007/138747 | 12/2007 |

* cited by examiner

| | | TREATMENT TEMPERATURE (°C) | OZONE SATURATED CONCENT-RATION (ppm) | RESIST LIFT-OFF STATE |
|---|---|---|---|---|
| COMPARATIVE EXAMPLE | SOM | 80 | 55~65 | × |
| EXAMPLE 1 | SOM : DIW 1 : 0.15 | 134 | | △ |
| EXAMPLE 2 | SOM : DIW 1 : 0.3 | 151 | | ○ |

SUBSTRATE TREATMENT APPARATUS AND SUBSTRATE TREATMENT METHOD

CROSS REFERENCE TO RELATED APPLICATION

This application is a divisional of U.S. patent application Ser. No. 13/954,188, filed Jul. 30, 2013, which claims the benefit of Japanese Patent Application No. 2012-176233, filed Aug. 8, 2012, which is incorporated herein by reference.

BACKGROUND OF THE INVENTION

1. Field of the Invention

The present invention relates to a substrate treatment apparatus and a substrate treatment method for removing a resist from a substrate such as a semiconductor wafer.

2. Description of Related Art

In production processes for semiconductor devices, liquid crystal display devices and the like, a substrate treatment apparatus of a single substrate treatment type adapted to treat a single substrate at a time is often used for treating a substrate front surface with a treatment liquid. The substrate treatment apparatus of the single substrate treatment type includes a spin chuck which generally horizontally holds and rotates the substrate, and a nozzle which spouts the treatment liquid toward the front surface of the substrate rotated by the spin chuck.

A semiconductor device production process, for example, includes the step of locally implanting an impurity such as phosphorus, arsenic or boron (ions) into a major surface (front surface) of a semiconductor wafer (hereinafter referred to simply as "wafer"). In order to prevent the ion implantation in an unnecessary portion of the wafer, a resist pattern of a photosensitive resin is formed on the front surface of the wafer to mask the unnecessary portion of the wafer with the resist in this step. After the ion implantation, the resist pattern formed on the front surface of the wafer becomes unnecessary and, therefore, a resist removing process is performed for removing the unnecessary resist.

In a typical example of the resist removing process, the front surface of the wafer is irradiated with oxygen plasma to ash the resist on the front surface of the wafer. Then, a chemical liquid such as a sulfuric acid/hydrogen peroxide mixture is supplied to the front surface of the wafer to remove the ashed resist. Thus, the resist is removed from the front surface of the wafer. However, the irradiation with the oxygen plasma for the ashing of the resist damages a portion of the front surface of the wafer uncovered with the resist (e.g., an oxide film exposed from the resist pattern).

In another example of the resist removing process, sulfuric acid ozone prepared by dissolving ozone gas in sulfuric acid (sulfuric acid solution) is supplied for lifting off the resist from the front surface of the wafer without the ashing. The resist lift-off process using the sulfuric acid ozone may be performed, for example, by means of a batch type apparatus disclosed in US2008/006295A1.

SUMMARY OF THE INVENTION

In the apparatus disclosed in US2008/006295A1, sulfuric acid is retained in a treatment vessel, and ozone gas is fed into the sulfuric acid retained in the treatment vessel. Sulfuric acid ozone is prepared by mixing the sulfuric acid and the ozone gas together, and retained in the treatment vessel. Then, a substrate (wafer) having a resist pattern formed on a front surface thereof is immersed in the sulfuric acid ozone. Peroxodisulfuric acid contained in the sulfuric acid ozone has oxidative power. The resist is removed from the substrate by the oxidative power of the peroxodisulfuric acid.

The peroxodisulfuric acid contained in the sulfuric acid ozone exhibits strong oxidative power at a higher temperature that is not lower than 140° C. Therefore, it is desirable to supply the sulfuric acid ozone at a higher temperature to the substrate for removing the resist with the use of the sulfuric acid ozone.

In addition to the batch type apparatus, an apparatus of a single substrate treatment type adapted to treat a single substrate at a time is another type of the substrate treatment apparatus for treating the substrate with the treatment liquid. The substrate treatment apparatus of the single substrate treatment type includes a spin chuck which generally horizontally holds and rotates the substrate, and a treatment liquid nozzle which supplies the treatment liquid toward a front surface of the substrate held by the spin chuck.

The inventors of the present invention contemplate that the sulfuric acid ozone is used as the treatment liquid to perform the resist removing process on the substrate by means of the substrate treatment apparatus of the single substrate treatment type. In particular, the inventors contemplate that the higher temperature sulfuric acid ozone is used for enhancing the resist removing capability in the resist removing process. In this case, more specifically, the sulfuric acid ozone is spouted from the treatment liquid nozzle toward the major surface (front surface) of the substrate held by the spin chuck.

A conceivable arrangement for the substrate treatment apparatus of the single substrate treatment type is such that sulfuric acid heated up to a higher temperature equivalent to a treatment temperature (140° C.) is retained in a tank, and sulfuric acid ozone is prepared by dissolving ozone gas in the sulfuric acid retained in the tank and supplied as the treatment liquid to the treatment liquid nozzle.

In this case, the ozone gas should be dissolved in the higher temperature sulfuric acid, so that a longer time may be required for the dissolution of the ozone gas. Further, the solubility of ozone in sulfuric acid is reduced as the liquid temperature of the sulfuric acid increases. Since the sulfuric acid retained in the tank has a higher temperature, the ozone in the sulfuric acid solution is liable to be gasified. Therefore, the sulfuric acid solution is liable to have a reduced ozone concentration. As a result, the sulfuric acid ozone supplied to the substrate is liable to contain only a small amount of peroxodisulfuric acid.

As described above, it is necessary to supply the sulfuric acid ozone containing a greater amount of peroxodisulfuric acid in the substrate treatment apparatus of the single substrate treatment type.

It is therefore an object of the present invention to provide a substrate treatment apparatus of a single substrate treatment type and a substrate treatment method, which are capable of advantageously removing a resist from a substrate by supplying sulfuric acid ozone containing a greater amount of peroxodisulfuric acid to the substrate.

The present invention provides a substrate treatment apparatus to be used for removing a resist from a front surface of a substrate, the apparatus including: a substrate holding unit which holds the substrate; and a sulfuric acid ozone/water supplying unit which supplies a sulfuric acid ozone/water mixture to the front surface of the substrate held by the substrate holding unit, the sulfuric acid ozone/water mixture being a mixture which is prepared by mixing water with sulfuric acid ozone prepared by dissolving ozone gas in sulfuric acid.

With this arrangement, the sulfuric acid ozone/water mixture is supplied to the front surface of the substrate. The sulfuric acid ozone contains peroxodisulfuric acid ($H_2S_2O_8$) which is a kind of persulfuric acid generated by the dissolution of the ozone gas. When the sulfuric acid ozone and the water are mixed together, dilution heat is generated by diluting the sulfuric acid ozone with the water, thereby increasing the temperature of the sulfuric acid ozone/water mixture to a predetermined higher temperature (e.g., not lower than 140° C.) that is not lower than the liquid temperature of the sulfuric acid ozone before the mixing.

In this case, the sulfuric acid ozone/water mixture can be supplied at the higher temperature to the front surface of the substrate even if lower temperature sulfuric acid ozone (e.g., at lower than 100° C.) is used as the sulfuric acid ozone before the mixing. Further, where the sulfuric acid ozone is kept at a predetermined lower temperature before the mixing, the sulfuric acid ozone can contain a greater amount of ozone gas dissolved therein before the mixing.

Therefore, the higher temperature sulfuric acid ozone containing a greater amount of ozone gas dissolved therein can be supplied to the front surface of the substrate. The sulfuric acid ozone in which a greater amount of ozone gas is dissolved contains a greater amount of peroxodisulfuric acid. In addition, the peroxodisulfuric acid exhibits stronger oxidative power at a higher temperature, so that the resist can be advantageously removed from the front surface of the substrate.

The sulfuric acid ozone/water mixture supplying unit preferably includes a liquid mixture nozzle which spouts the sulfuric acid ozone/water mixture toward the front surface of the substrate held by the substrate holding unit.

With this arrangement, the sulfuric acid ozone/water mixture containing a greater amount of ozone gas dissolved therein is spouted from the liquid mixture nozzle. Thus, the higher temperature sulfuric acid ozone containing a greater amount of peroxodisulfuric acid can be supplied to the front surface of the substrate by means of the simple arrangement.

According to one embodiment of the present invention, the sulfuric acid ozone/water mixture supplying unit further includes a mixing portion which mixes the sulfuric acid ozone and the water together, a sulfuric acid ozone supplying portion which feeds the sulfuric acid ozone to the mixing portion, and a liquid mixture supply pipe which supplies the sulfuric acid ozone/water mixture prepared by the mixing in the mixing portion to the liquid mixture nozzle.

With this arrangement, the sulfuric acid ozone and the water are mixed together in the mixing portion connected to the liquid mixture supply pipe. Therefore, the sulfuric acid ozone/water mixture is spouted from the liquid mixture nozzle substantially immediately after the mixing. Therefore, the sulfuric acid ozone/water mixture which is substantially free from reduction in peroxodisulfuric acid amount (concentration) can act on the resist present on the front surface of the substrate. Thus, the resist can be more advantageously removed from the front surface of the substrate.

In this case, the sulfuric acid ozone supplying portion preferably includes a sulfuric acid ozone retaining portion which retains the sulfuric acid ozone, and a circulation passage connected to the sulfuric acid ozone retaining portion and the mixing portion to circulate the sulfuric acid ozone from the sulfuric acid ozone retaining portion back into the sulfuric acid ozone retaining portion therethrough.

According to another embodiment of the present invention, the liquid mixture nozzle includes a mixing chamber in which the sulfuric acid ozone and the water are mixed together, a sulfuric acid ozone inlet port through which the sulfuric acid ozone is fed into the mixing chamber, a water inlet port through which the water is fed into the mixing chamber, and a liquid mixture outlet port from which the sulfuric acid ozone/water mixture prepared by the mixing in the mixing chamber is spouted.

With this arrangement, the sulfuric acid ozone and the water are mixed together within the liquid mixture nozzle. Therefore, the sulfuric acid ozone/water mixture is supplied to the front surface of the substrate immediately after the mixing. Accordingly, the sulfuric acid ozone/water mixture which is substantially free from reduction in peroxodisulfuric acid amount (concentration) can act on the resist present on the front surface of the substrate. Thus, the resist can be more advantageously removed from the front surface of the substrate.

The sulfuric acid ozone/water mixture supplying unit may include a sulfuric acid ozone nozzle which spouts the sulfuric acid ozone toward the front surface of the substrate held by the substrate holding unit, and a water nozzle which spouts the water toward the front surface of the substrate held by the substrate holding unit.

With this arrangement, the sulfuric acid ozone spouted from the sulfuric acid ozone nozzle and the water spouted from the water nozzle are mixed together on the front surface of the substrate, so that the sulfuric acid ozone/water mixture which is substantially free from reduction in peroxodisulfuric acid amount (concentration) can act on the resist present on the front surface of the substrate. Thus, the resist can be more advantageously removed from the front surface of the substrate.

The present invention further provides a substrate treatment method to be used for removing a resist from a substrate front surface, the method comprising a sulfuric acid ozone/water mixture supplying step of supplying a sulfuric acid ozone/water mixture to a front surface of a substrate held by a substrate holding unit, the sulfuric acid ozone/water mixture being a mixture which is prepared by mixing water with sulfuric acid ozone prepared by dissolving ozone gas in sulfuric acid.

In this method, the sulfuric acid ozone/water mixture is supplied to the front surface of the substrate. The sulfuric acid ozone contains peroxodisulfuric acid ($H_2S_2O_8$) which is a kind of persulfuric acid generated by the dissolution of the ozone gas. When the sulfuric acid ozone and the water are mixed together, dilution heat is generated by diluting the sulfuric acid ozone with the water, thereby increasing the temperature of the sulfuric acid ozone/water mixture to a predetermined higher temperature (e.g., not lower than 140° C.) that is not lower than the liquid temperature of the sulfuric acid ozone before the mixing.

In this case, the sulfuric acid ozone/water mixture can be supplied at the higher temperature to the front surface of the substrate even if lower temperature sulfuric acid ozone (e.g., at lower than 100° C.) is used as the sulfuric acid ozone before the mixing. Further, where the sulfuric acid ozone is kept at a predetermined lower temperature before the mixing, the sulfuric acid ozone can contain a greater amount of ozone gas dissolved therein before the mixing.

Thus, the higher temperature sulfuric acid ozone containing a greater amount of ozone gas dissolved therein can be supplied to the front surface of the substrate. The sulfuric acid ozone in which a greater amount of ozone gas is dissolved contains a greater amount of peroxodisulfuric acid. In addition, the peroxodisulfuric acid exhibits stronger oxidative power at a higher temperature, so that the resist can be advantageously removed from the front surface of the substrate.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
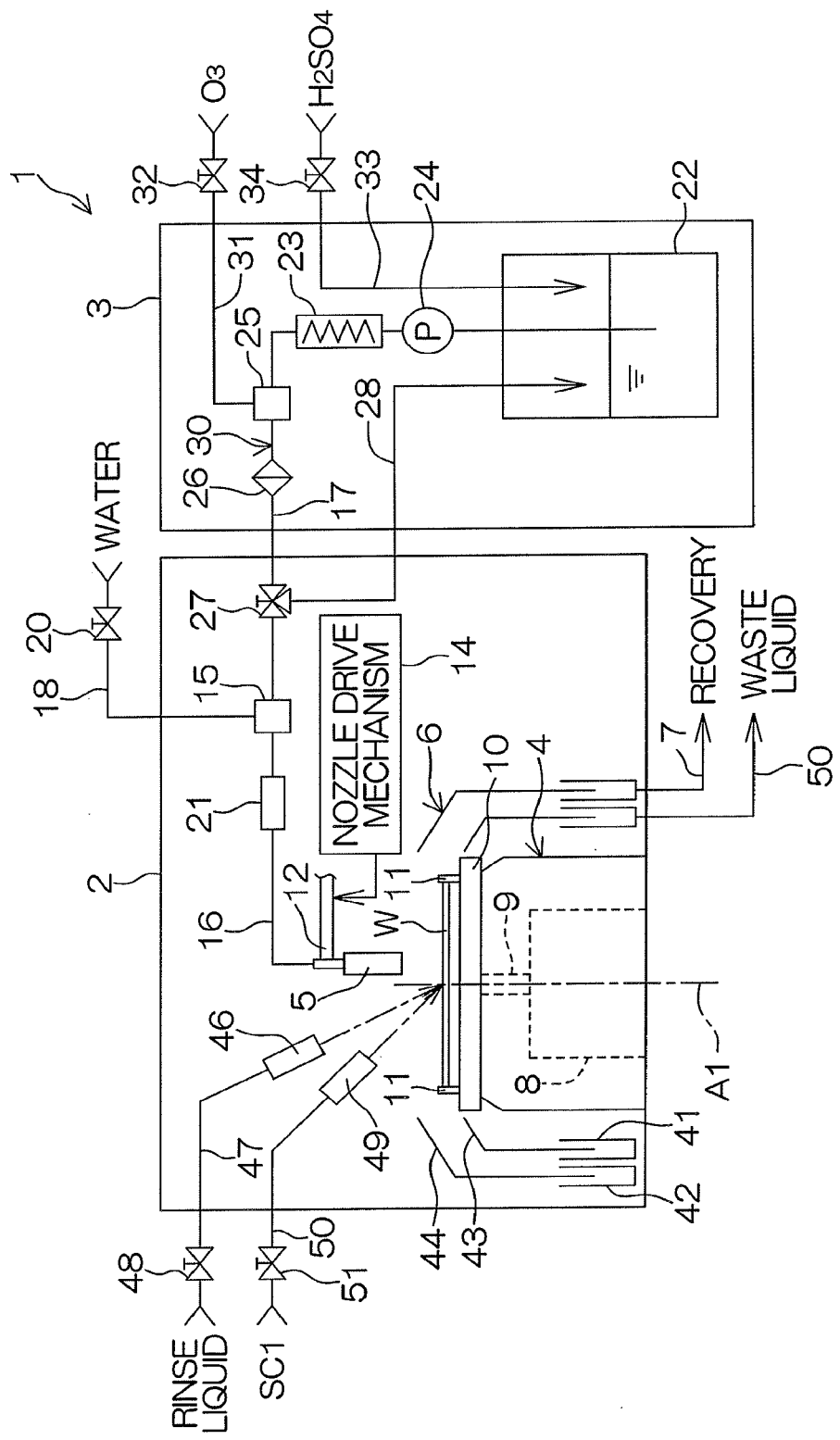
FIG. 1 is a diagram schematically showing the construction of a substrate treatment apparatus according to one embodiment of the present invention.

FIG. 1 is a diagram schematically showing the construction of a substrate treatment apparatus 1 according to one embodiment of the present invention. The substrate treatment apparatus 1 is an apparatus of a single wafer treatment type adapted to treat a single round wafer W (an example of the substrate) at a time. The substrate treatment apparatus 1 includes a treatment chamber 2 in which a resist removing process is performed to remove an unnecessary resist from a front surface (major surface) of a wafer W after an ion implantation process is performed to implant an impurity into the front surface of the wafer W or after a dry etching process is performed on the front surface of the wafer W, and a sulfuric acid ozone supplying portion 3 provided separately from the treatment chamber 2 for supplying sulfuric acid ozone (a liquid prepare by dissolving ozone gas in sulfuric acid) to the treatment chamber 2.

The treatment chamber 2 is defined by a partition wall, and accommodates therein a spin chuck (substrate holding unit) 4 which generally horizontally holds the wafer W and rotates the wafer W about a rotation axis (vertical axis) A1 vertically extending through the center thereof, a sulfuric acid ozone/water nozzle (liquid mixture nozzle) 5 which spouts a sulfuric acid ozone/water mixture (a mixture of sulfuric acid ozone and water) toward the front surface of the wafer W held by the spin chuck 4, and a container-like cup 6 which surrounds the spin chuck 4 to receive the sulfuric acid ozone/water mixture, a rinse liquid and SC1 (ammonia/hydrogen peroxide mixture) flowing down or splashed from the wafer W.

The spin chuck 4 is, for example, of a clamping type. More specifically, the spin chuck 4 includes a spin motor 8, a spin shaft 9 unitary with a drive shaft of the spin motor 8, a disk-shaped spin base 10 generally horizontally attached to an upper end of the spin shaft 9, and a plurality of clamping members 11 which are arranged generally equidistantly on a peripheral edge portion of the spin base 10. Thus, the spin chuck 4 is capable of rotating the horizontally held wafer W together with the spin base 10 about the rotation axis A1 by rotating the spin base 10 by a rotative drive force of the spin motor 8 with the wafer W clamped by the clamping members 11.

The spin chuck 4 is not limited to the clamping type, but may be of a vacuum suction type (vacuum chuck) capable of horizontally holding the wafer W by sucking a back surface of the wafer W by vacuum and rotating about the vertical rotation axis in this state to rotate the wafer W held by the spin chuck 4.

The cup 6 includes a hollow cylindrical first cup 41 which collects the rinse liquid and the SC1, a hollow cylindrical second cup 42 which collects the sulfuric acid ozone/water mixture, a hollow cylindrical first guard 43 which is movable up and down with respect to the first cup 41, a hollow cylindrical second guard 44 which is movable up and down with respect to the second cup 42, and a guard lift mechanism 45 (see FIG. 2) which independently moves up and down the first guard 43 and the second guard 44. A waste liquid line 50 is connected to a bottom of the first cup 41. The waste liquid line 50 is connected to a waste liquid treatment facility (not shown) provided outside the substrate treatment apparatus 1. A recovery line 7 for recovering the sulfuric acid ozone/water mixture is connected to a bottom of the second cup 42. The guard lift mechanism 45 moves up and down the respective guards 43, 44 between an upper position at which an upper end of the guard 43, 44 is located at a higher level than the wafer W and a lower position at which the upper end of the guard 43, 44 is located at a lower level than the wafer W.

The sulfuric acid ozone/water nozzle 5 is attached to a distal end of an arm 12 generally horizontally extending above the spin chuck 4. The arm 12 is supported by an arm support shaft (not shown) generally vertically extending on a lateral side of the spin chuck 4. A nozzle drive mechanism 14 is connected to the arm 12 so that the arm 12 can be pivoted about the arm support shaft by a drive force of the nozzle drive mechanism 14. A sulfuric acid ozone/water supply pipe (liquid mixture supply pipe) 16 extending from a water mixing portion (mixing portion) 15 is connected at its distal end to the sulfuric acid ozone/water nozzle 5.

A sulfuric acid ozone supply pipe 17 to which sulfuric acid ozone (prepared, for example, by dissolving ozone gas at a higher ozone concentration on the order of 55 to 65 ppm in 96 to 98 wt % concentrated sulfuric acid) is supplied from the sulfuric acid ozone supply portion 3 and a water supply pipe 18 to which water is supplied are connected to the water mixing portion 15. The water is supplied from a water supply source to the water supply pipe 18. A water valve 20 which opens and closes the water supply pipe 18 is provided in the water supply pipe 18. Examples to the water to be supplied to the water supply pipe 18 include DIW (deionized water), carbonated water, electrolytic ion water, ozone water, reduced water (hydrogen water) and magnetic water.

The sulfuric acid ozone to be supplied to the sulfuric acid ozone supply pipe 17 is maintained at a predetermined lower temperature (lower than 100° C., e.g., about 80° C.) in the sulfuric acid ozone supplying portion 3. The water to be supplied to the water supply pipe 18 has a liquid temperature equal to an ordinary temperature (about 25° C.). The flow rate ratio (weight ratio) between the sulfuric acid ozone supplied to the sulfuric acid ozone supply pipe 17 and the water supplied to the water supply pipe 18 is, for example, 1:not less than 0.1 and less than 0.4, for example, 1:0.3.

A stirring flow pipe 21 is provided in the sulfuric acid ozone/water supply pipe 16. The stirring flow pipe 21 includes a pipe member, and a plurality of stirring fins of rectangular plates which are each twisted approximately 180 degrees about an axis extending in a liquid flow direction and arranged along a pipe center axis extending in the liquid flow direction in the pipe member with their twist angular positions alternately offset by 90 degrees about the pipe center axis. It is noted that the stirring flow pipe 21 is not necessarily required.

The sulfuric acid ozone supplying portion 3 is defined by a partition wall, and includes a sulfuric acid ozone tank (sulfuric acid ozone retaining portion) 22 which retains the sulfuric acid ozone to be supplied to the water mixing portion 15, and the sulfuric acid ozone supply pipe 17 described above. In the sulfuric acid ozone retained in the sulfuric acid ozone tank 22, sulfate ions ($SO_4^{2-}$) present in sulfuric acid are oxidized through an oxidation reaction to generate peroxodisulfuric acid ($H_2S_2O_8$) that has stronger oxidative power than peroxomonosulfuric acid.

The sulfuric acid ozone supply pipe 17 is connected at its one end to the water mixing portion 15, and connected at its other end to the sulfuric acid ozone tank 22. A pump 24, a heater 23, an ozone gas mixing portion 25, a filter 26 and a three-way valve 27 are provided in this order from the sulfuric acid ozone tank 22 in the sulfuric acid ozone supply pipe 17. The heater 23 is capable of controlling the temperature of the sulfuric acid ozone flowing through the sulfuric acid ozone supply pipe 17. The pump 24 is capable of pumping the sulfuric acid ozone from the sulfuric acid ozone tank 22 into the sulfuric acid ozone supply pipe 17. The pump 24 is constantly driven to constantly pump up the sulfuric acid ozone from the sulfuric acid ozone tank 22. The filter 26 is capable of removing foreign matter from the sulfuric acid ozone flowing through the sulfuric acid ozone supply pipe 17.

A return pipe 28 through which the sulfuric acid ozone flowing through the sulfuric acid ozone supply pipe 17 is returned into the sulfuric acid ozone tank 22 is connected to the three-way valve 27 to be branched from the sulfuric acid ozone supply pipe 17. Thus, a circulation passage 30 is formed which extends from the sulfuric acid ozone tank 22 to the three-way valve 27 through the sulfuric acid ozone supply pipe 17 and back to the sulfuric acid ozone tank 22 through the return pipe 28. The three-way valve 27 feeds the sulfuric acid ozone flowing through the sulfuric acid ozone supply pipe 17 selectively to the water mixing portion 15 or to the return pipe 28.

An ozone gas supply pipe 31 which supplies ozone gas from an ozone gas generation source is connected to the ozone gas mixing portion 25 to be branched from the sulfuric acid ozone supply pipe 17. An ozone gas valve 32 which opens and closes the ozone gas supply pipe 31 is provided in the ozone gas supply pipe 31. The ozone gas mixing portion 25 is adapted to mix the ozone gas with the sulfuric acid ozone flowing through the sulfuric acid ozone supply pipe 17.

A sulfuric acid replenishment pipe 33 through which fresh sulfuric acid (e.g., fresh concentrated sulfuric acid having a concentration of 96 to 98 wt %) is supplied to the sulfuric acid ozone tank 22 for replenishment is connected to the sulfuric acid ozone tank 22. A replenishment valve 34 which opens and closes the sulfuric acid replenishment pipe 33 is provided in the sulfuric acid replenishment pipe 33. By opening and closing the replenishment valve 34, the supply of the fresh sulfuric acid to the sulfuric acid ozone tank 22 is switched on and off. The supply of the fresh sulfuric acid to the sulfuric acid ozone tank 22 for the replenishment is carried out when the sulfuric acid ozone tank 22 is empty or when the amount of the sulfuric acid ozone retained in the sulfuric acid ozone tank 22 is reduced to less than a predetermined amount.

On the other hand, the recovery line 7 is connected at its one end to a bottom of the cup 6 (second cup 42), and connected at its other end to a recycling device (not shown) provided outside the substrate treatment apparatus 1. The sulfuric acid ozone received by the cup 6 (second cup 42) is fed into the recycling device through the recovery line 7, then subjected to a predetermined treatment in the recycling device, and supplied to the sulfuric acid supplying portion 3.

When the three-way valve 27 is controlled to feed the sulfuric acid ozone from the sulfuric acid ozone supply pipe 17 to the return pipe 28 with the pump 24 driven, the sulfuric acid ozone pumped up from the sulfuric acid ozone tank 22 flows through the heater 23, the filter 26, the three-way valve 27 and the return pipe 28 back into the sulfuric acid ozone tank 22. Thus, the sulfuric acid ozone is circulated from the sulfuric acid ozone tank 22 through the circulation passage 30. The sulfuric acid ozone circulated from the sulfuric acid ozone tank 22 through the circulation passage 30 is temperature-controlled by the heater 23 to be maintained at the predetermined lower temperature (e.g., about 80° C.). The concentration of the sulfuric acid ozone in the sulfuric acid ozone tank 22 (the ozone concentration of the sulfuric acid ozone) is constantly controlled by opening and closing the replenishment valve 34 and the ozone gas valve 32. The sulfuric acid ozone circulated from the sulfuric acid ozone tank 22 through the circulation passage 30 is filtered by the filter 26, whereby particles and other foreign matter are removed from the sulfuric acid ozone. This substantially prevents sulfuric acid ozone containing foreign matter from being supplied to the sulfuric acid ozone/water nozzle 5.

When the three-way valve 27 is controlled to feed the sulfuric acid ozone from the sulfuric acid ozone supply pipe 17 to the water mixing portion 15 with the pump 24 driven, the sulfuric acid ozone pumped up from the sulfuric acid ozone tank 22 flows through the heater 23, the filter 26 and the three-way valve 27 into the water mixing portion 15. At the same time, the water valve 20 is opened, whereby the water flows into the water mixing portion 15. Thus, the sulfuric acid ozone and the water flow from the water mixing portion 15 toward the sulfuric acid ozone/water nozzle 5 through the sulfuric acid ozone/water supply pipe 16. The sulfuric acid ozone and the water pass through the stirring flow pipe 21 to be thereby sufficiently stirred, when flowing through the sulfuric acid ozone/water supply pipe 16. The stirring causes the sulfuric acid ozone to sufficiently react with the water, and dilution heat generated when the sulfuric acid ozone is diluted with the water increases the temperature of the sulfuric acid ozone to a temperature not lower than the liquid temperature (e.g., about 80° C.) of the sulfuric acid ozone before the mixing. Thus, the sulfuric acid ozone/water mixture is spouted from an outlet port of the sulfuric acid ozone/water nozzle 5 at a predetermined higher temperature (not lower than 140° C., e.g., about 150° C.) that is optimum for the resist removing process.

The substrate treatment apparatus 1 further includes a rinse liquid nozzle 46 which supplies a rinse liquid to the front surface of the wafer W held by the spin chuck 4, and an SC1 nozzle 49 which supplies SC1 as a cleaning chemical liquid to the front surface of the wafer W held by the spin chuck 4. The rinse liquid nozzle 46 is, for example, a straight nozzle which spouts the rinse liquid in the form of a continuous stream, and is fixedly provided above the spin chuck 4 with its outlet port directing toward around the rotation center of the wafer W. A rinse liquid supply pipe 47 to which the rinse liquid is supplied from a rinse liquid supply source is connected to the rinse liquid nozzle 46. Examples of the rinse liquid include DIW, carbonated water, electrolytic ion water, ozone water, reduced water (hydrogen water) and magnetic water. A rinse liquid valve 48 which switches on and off the supply of the rinse liquid from the rinse liquid nozzle 46 is provided in the rinse liquid supply pipe 47.

The SC1 nozzle 49 is, for example, a straight nozzle which spouts the SC1 in the form of a continuous stream, and is fixedly provided above the spin chuck 4 with its outlet port directing toward around the rotation center of the wafer W. An SC1 supply pipe 50 to which the SC1 is supplied from an SC1 supply source is connected to the SC1 nozzle 49. An SC1 valve 51 which switches on and off the supply of the SC1 from the SC1 nozzle 49 is provided in the SC1 supply pipe 50.

Figure 2:
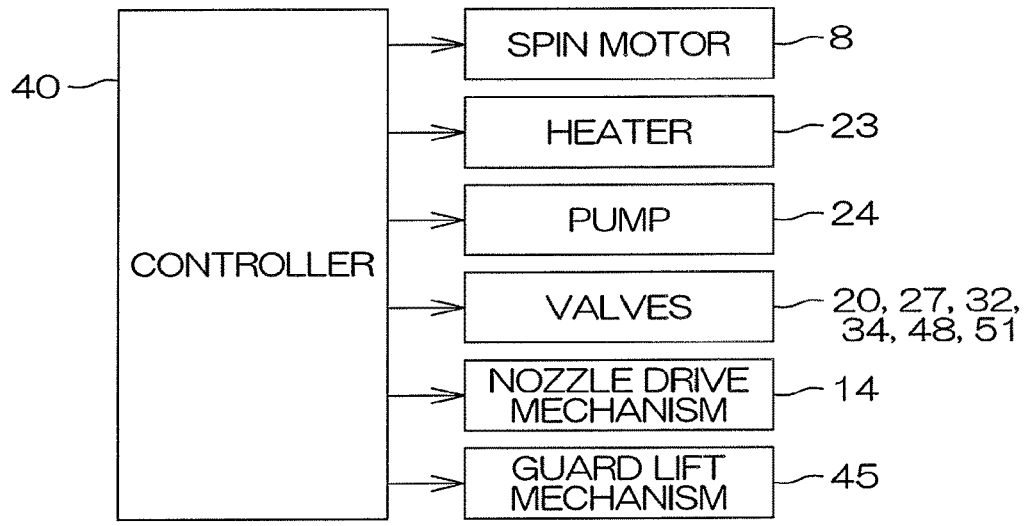
FIG. 2 is a block diagram showing the electrical construction of the substrate treatment apparatus shown in FIG. 1.

FIG. 2 is a block diagram showing the electrical construction of the substrate treatment apparatus 1.

The substrate treatment apparatus 1 includes a controller 40 configured to include a microcomputer. The controller 40 controls the operations of the spin motor 8, the nozzle movement mechanism 14, the pump 24, the guard lift mechanism 45 and the like. The controller 40 switches on and off energization of the heater 23. Further, the controller 40 controls the switching operation of the three-way valve 27 and the opening and closing operations of the ozone gas valve 32, the replenishment valve 34 and the like.

Figure 3:
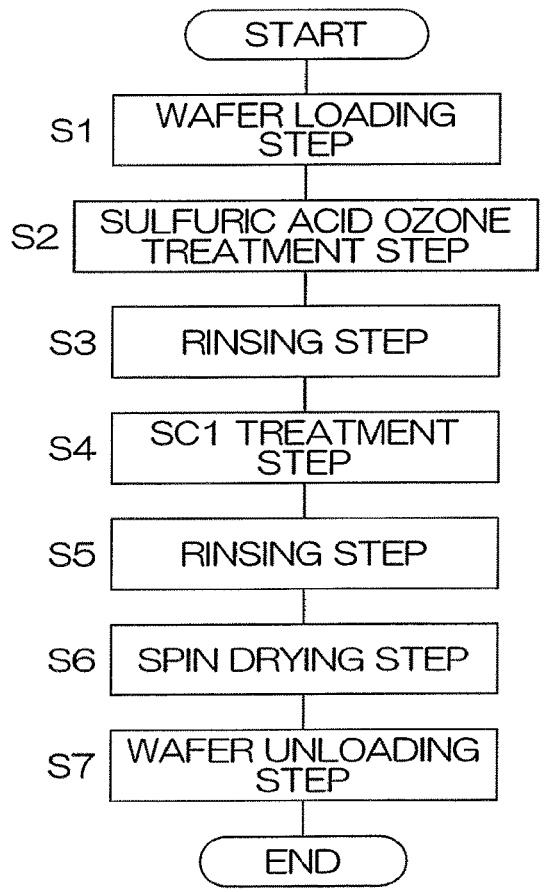
FIG. 3 is a process diagram showing an exemplary resist removing process to be performed by the substrate treatment apparatus shown in FIG. 1.

FIG. 3 is a process diagram showing an exemplary resist removing process to be performed by the substrate treatment apparatus 1. Referring to FIGS. 1 to 3, the exemplary process to be performed by the substrate treatment apparatus 1 will hereinafter be described.

In the resist removing process, a transport robot (not shown) is controlled to load a wafer W subjected to the ion implantation process into the treatment chamber 2 (Step S1: wafer loading step). It is herein assumed that the wafer W is not subjected to a resist ashing process. The wafer W is transferred to the spin chuck 4 with its front surface facing up. During the loading of the wafer W, the sulfuric acid ozone/water nozzle 5 is retracted to a lateral side of the spin chuck 4, and the first and second guards 43, 44 are moved down to the lower position in order to prevent the transport robot and the wafer W from colliding with the sulfuric acid ozone/water nozzle 5 and the guards 43, 44.

In turn, a sulfuric acid ozone treatment step (sulfuric acid ozone/water mixture supplying step) is performed in which the sulfuric acid ozone is supplied to the wafer W (Step S2). More specifically, the controller 40 controls the nozzle movement mechanism 14 to move the sulfuric acid ozone/water nozzle 5 to above the rotation center of the wafer W held by the spin chuck 4. The controller 40 controls the guard lift mechanism 45 to move down the first guard 43 to the lower position and move up the second guard 44 to the upper position. Further, the controller 40 controls the spin motor 8 to rotate the wafer W held by the spin chuck 4. Then, the controller 40 spouts the sulfuric acid ozone/water mixture from the sulfuric acid ozone/water nozzle 5 toward the rotation center of the front surface of the wafer W, while causing the spin chuck 4 to rotate the wafer W. Thus, the sulfuric acid ozone/water mixture is supplied to the entire front surface of the wafer W, whereby the front surface of the wafer W is treated with the sulfuric acid ozone/water mixture (sulfuric acid ozone treatment).

The sulfuric acid ozone/water mixture containing a greater amount of ozone gas dissolved therein is spouted at the higher temperature (e.g., about 150° C.) from the sulfuric acid ozone/water nozzle 5. Since a greater amount of ozone gas is dissolved in the sulfuric acid ozone, the sulfuric acid ozone contains a greater amount of peroxodisulfuric acid. In addition, the sulfuric acid ozone has a higher temperature (e.g., about 150° C.) at which the peroxodisulfuric acid exhibits stronger oxidative power. Therefore, the resist can be advantageously removed from the front surface of the wafer W. The sulfuric acid ozone/water mixture is splashed from the peripheral edge portion of the front surface of the wafer W, and received by the interior wall of the second guard 44 to be retained in a bottom portion of the second cup 42 and recovered through the recovery line 7.

After the sulfuric acid ozone treatment is performed for a predetermined period, the controller 40 stops spouting the sulfuric acid ozone/water mixture from the sulfuric acid ozone/water nozzle 5. Thereafter, the controller 40 controls the nozzle drive mechanism 14 to retract the sulfuric acid ozone/water nozzle 5 to the lateral side of the spin chuck 4. The controller 40 controls the guard lift mechanism 45 to move up the first and second guards 43, 44 to the upper position.

In the sulfuric acid ozone treatment step, the nozzle drive mechanism 14 may be controlled so that a supplying position at which the sulfuric acid ozone/water mixture is supplied from the sulfuric acid ozone/water nozzle 5 on the front surface of the wafer W is reciprocally moved along an arcuate path crossing a wafer rotating direction within a region extending from the rotation center of the wafer W to the peripheral edge portion of the wafer W.

Subsequently, a rinsing step is performed in which the rinse liquid is supplied to the wafer W (Step S3). More specifically, the controller 40 opens the rinse liquid valve 48 to spout the rinse liquid from the rinse liquid nozzle 46 toward the center portion of the front surface of the wafer W, while causing the spin chuck 4 to rotate the wafer W. Thus, the rinse liquid is supplied to the entire front surface of the wafer W, whereby the sulfuric acid ozone adhering to the wafer W is rinsed away with the rinse liquid (rinsing process). The rinse liquid (rinse liquid containing the sulfuric acid ozone) is splashed from the peripheral edge portion of the front surface of the wafer W, and received by the interior wall of the first guard 43 to be retained in a bottom portion of the first cup 41 and drained through the waste liquid line 50. After the rinsing process is performed for a predetermined period, the controller 40 closes the rinse liquid valve 48 to stop spouting the rinse liquid from the rinse liquid nozzle 46.

In turn, an SC1 treatment step is performed in which the SC1 is supplied to the wafer W (Step S4). More specifically, the controller 40 opens the SC1 valve 51 to spout the SC1 from the SC1 nozzle 49 toward the center portion of the front surface of the wafer W, while causing the spin chuck 4 to rotate the wafer W. Thus, the SC1 is supplied to the entire front surface of the wafer W, whereby the sulfuric acid adhering to the wafer W is washed away with the SC1 (SC1 treatment). The SC1 is splashed from the peripheral edge portion of the front surface of the wafer W, and received by the interior wall of the first guard 43 to be retained in the bottom portion of the first cup 41 and drained through the waste liquid line 50. After the SC1 treatment is performed for a predetermined period, the controller 40 closes the SC1 valve 51 to stop spouting the SC1 from the SC1 nozzle 49.

Where the SC1 nozzle 49 is a movable nozzle like the sulfuric acid ozone/water nozzle 5, a supplying position at which the SC1 is supplied from the SC1 nozzle 49 on the front surface of the wafer W is reciprocally moved along an arcuate path crossing the wafer rotating direction within the region extending from the rotation center of the wafer W to the peripheral edge portion of the wafer W in the SC1 treatment step.

In turn, a rinsing step is performed in which the rinse liquid is supplied to the wafer W (Step S5). More specifically, the controller 40 opens the rinse liquid valve 48 to spout the rinse liquid from the rinse liquid nozzle 46 toward the center portion of the front surface of the wafer W, while causing the spin chuck 4 to rotate the wafer W. Thus, the rinse liquid is supplied to the entire front surface of the wafer W, whereby the SC1 adhering to the wafer W is rinsed away with the rinse liquid (rinsing process). The rinse liquid (rinse liquid containing the SC1) is splashed from the peripheral edge portion of the front surface of the wafer W, and received by the interior wall of the first guard 43 to be retained in the bottom portion of the first cup 43 and drained through the waste liquid line 50. After the rinsing process is performed for a predetermined period, the controller 40 closes the rinse liquid valve 48 to stop spouting the rinse liquid from the rinse liquid nozzle 46.

Subsequently, a spin drying step is performed to spin-dry the wafer W (Step S6). More specifically, the controller 40 controls the spin motor 8 to rotate the wafer W at a higher rotation speed (e.g., not lower than 2500 rpm). Thus, the rinse liquid adhering to the front surface of the wafer W is spun off around the wafer W. Thus, the rinse liquid is removed from the wafer W to dry the wafer W (spin drying process). After the spin drying process is performed for a predetermined period, the controller 40 controls the spin motor 8 to cause the spin chuck 4 to stop rotating the wafer W, and controls the guard lift mechanism 45 to move down the first guard 43 and the second guard 44 to the lower position. Thus, the resist removing process on the single wafer W is completed. The transport robot (not shown) unloads the treated wafer W from the treatment chamber 2 (Step S7).

Figures 4, 5:
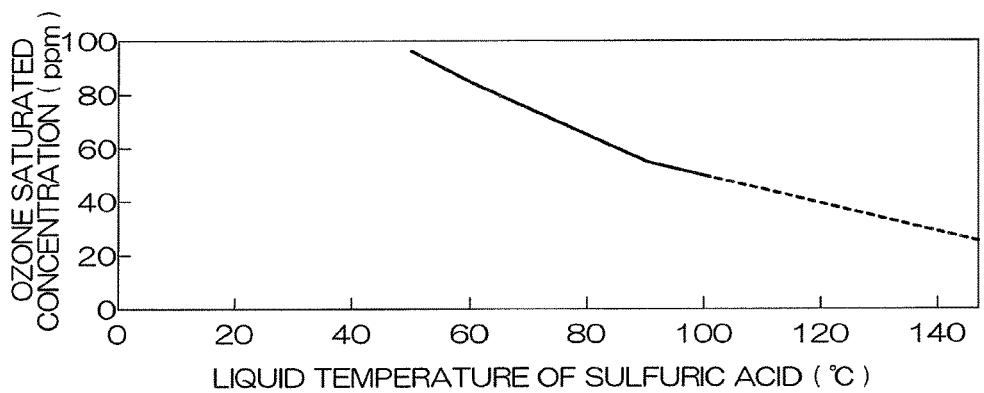
FIG. 4 is a diagram showing a relationship between the liquid temperature of sulfuric acid and the ozone saturated concentration of sulfuric acid.
FIG. 5 is a diagram showing the results of a resist removing test.

FIG. 4 is a diagram showing a relationship between the liquid temperature of sulfuric acid and the ozone saturated concentration of sulfuric acid.

FIG. 4 indicates that the ozone saturated concentration of sulfuric acid is reduced as the liquid temperature of sulfuric acid increases.

Since the sulfuric acid ozone is circulated at the predetermined lower temperature (e.g., about 80° C.) through the circulation passage 30 in the sulfuric acid ozone supplying portion 3, the circulated sulfuric acid ozone can have a higher ozone concentration (55 to 65 ppm).

According to this embodiment, as described above, the sulfuric acid ozone/water mixture prepared by mixing the sulfuric acid ozone and the water together is supplied to the front surface of the wafer W from the sulfuric acid ozone/water nozzle 5. The sulfuric acid ozone contains peroxodisulfuric acid ($H_2S_2O_8$) which is a kind of persulfuric acid generated by the dissolution of the ozone gas. When the sulfuric acid ozone and the water are mixed together, dilution heat is generated by diluting the sulfuric acid ozone with the water, thereby increasing the temperature of the sulfuric acid ozone/water mixture to a temperature not lower than the liquid temperature of the sulfuric acid ozone before the mixing.

Further, the sulfuric acid ozone having the predetermined lower temperature (e.g., about 80° C.) is used as the sulfuric acid ozone before the mixing. Since the sulfuric acid ozone has the lower temperature before the mixing, a greater amount of ozone gas can be dissolved in the sulfuric acid ozone before the mixing. That is, the sulfuric acid ozone has a higher ozone concentration before the mixing.

Therefore, the sulfuric acid ozone containing a greater amount of ozone gas can be supplied at the higher temperature (e.g., about 150° C.) to the front surface of the wafer W. Since a greater amount of ozone gas is dissolved in the sulfuric acid ozone, a greater amount of peroxodisulfuric acid is contained in the sulfuric acid ozone. In addition, the peroxodisulfuric acid exhibits stronger oxidative power at a higher temperature, so that the resist can be advantageously removed from the front surface of the wafer W.

The sulfuric acid ozone and the water are mixed together in the water mixing portion 15 connected to the sulfuric acid ozone/water supply pipe 16. Therefore, the sulfuric acid ozone/water mixture is spouted from the sulfuric acid ozone/water nozzle 5 substantially immediately after the mixing. Accordingly, the sulfuric acid ozone/water mixture which is substantially free from reduction in peroxodisulfuric acid amount (concentration) can act on the resist present on the front surface of the wafer W. Thus, the resist can be more advantageously removed from the front surface of the wafer W.

Next, a resist removing test will be described.

A resist removing test was performed by the substrate treatment apparatus 1 to remove (lift off) an unashed resist from a front surface of a wafer W. The front surface of the wafer W to be subjected to the resist removing test was entirely covered with the resist. After the resist removing test, the front surface of the wafer W was checked for resist lift-off state. More specifically, the area percentage of a region (lift-off region) of the front surface of the wafer W from which the resist is removed (lifted off) was determined with respect to the entire front surface of the wafer W through visual inspection. In the resist removing test, the exemplary process shown in FIG. 3 was performed, and the treatment period was 160 seconds. DIW was used as the water to be mixed with the sulfuric acid ozone. In the resist removing test, the threshold of the percentage of the lift-off region was defined to be 80% by way of example. If the percentage of the lift-off region is not less than 80%, the standard requirements are satisfied. If the percentage of the lift-off region is less than 80%, the standard requirements are not satisfied.

Example 1

The flow rate ratio (weight ratio) between the sulfuric acid ozone (SOM) and the DIW in the sulfuric acid ozone/water mixture was 1:0.15 by way of example. The liquid temperature (treatment temperature) of the sulfuric acid ozone/water mixture spouted from the sulfuric acid ozone/water nozzle 5 after the mixing was 134° C.

Example 2

The flow rate ratio (weight ratio) between the sulfuric acid ozone and the DIW in the sulfuric acid ozone/water mixture was 1:0.3 by way of example. The liquid temperature (treatment temperature) of the sulfuric acid ozone/water mixture spouted from the sulfuric acid ozone/water nozzle 5 after the mixing was 151° C.

Comparative Example

The water was not mixed with the sulfuric acid ozone, but only the sulfuric acid ozone was spouted at 80° C. (treatment temperature) from the sulfuric acid ozone/water nozzle 5.

FIG. 5 is a diagram showing the results of the resist removing test.

In Examples 1 and 2, as shown in FIG. 5, the percentage of the lift-off region was not less than 80%. In Example 1, particularly, the percentage of the lift-off region was not less than 90%, indicating a very high lift-off capability.

While one embodiment of the present invention has thus been described, the invention may be embodied in other ways.

Figure 6:
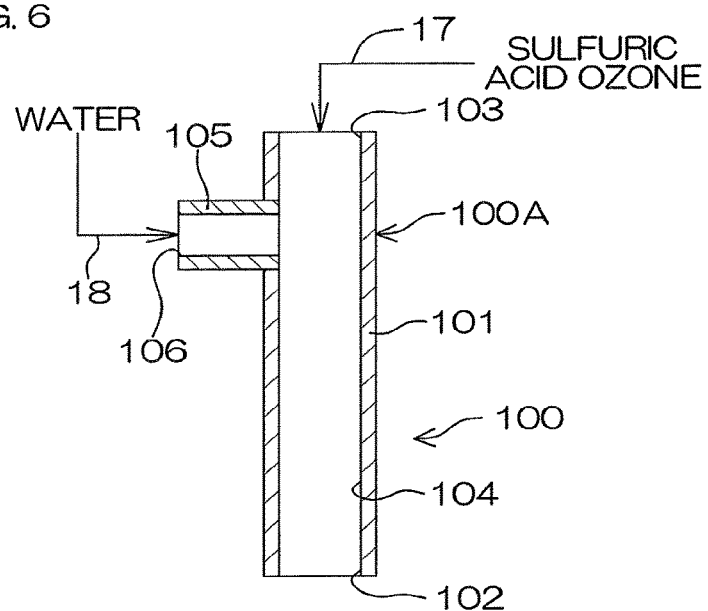
FIG. 6 is a diagram schematically showing the construction of a substrate treatment apparatus according to another embodiment of the present invention.

As shown in FIG. 6, the sulfuric acid ozone and the water may be mixed together within the sulfuric acid ozone/water nozzle. In this case, the water mixing portion 15 is obviated, and a sulfuric acid ozone/water nozzle (liquid mixture nozzle) 100 is provided at a distal end of the sulfuric acid ozone supply pipe 17. The sulfuric acid ozone/water nozzle 100 has, for example, a so-called straight nozzle structure, and includes a casing 100A. The casing 100A includes a hollow cylindrical flow pipe 101 and a water inlet pipe 105 connected at its one end to an upstream end portion of the flow pipe 101. The water inlet pipe 105 has a water inlet port 106 at its other end which is connected to the water supply pipe 18. The flow pipe 101 has an outlet port (liquid mixture outlet port) 102 at its distal end for spouting the sulfuric acid ozone/water mixture toward the outside. The flow pipe 101 has a sulfuric acid ozone inlet port 103 at its proximal end for feeding the sulfuric acid ozone therein. The sulfuric acid ozone inlet port 103 is connected to the distal end of the sulfuric acid ozone supply pipe 17. The flow pipe 101 includes a mixing chamber 104 defined therein. The mixing chamber 104 has an open distal end which serves as the outlet port 102. The sulfuric acid ozone supplied from the sulfuric acid ozone inlet port 103 and the water supplied from the water inlet port 106 (for the dilution) are fed into the mixing chamber 104, and mixed together. The sulfuric acid ozone/water mixture prepared by the mixing in the mixing chamber 104 is spouted downward from the outlet port 102.

In this case, the sulfuric acid ozone and the water are mixed together within the sulfuric acid ozone/water nozzle 100. Therefore, the sulfuric acid ozone/water mixture is supplied to the front surface of the wafer W immediately after the mixing. Accordingly, the sulfuric acid ozone/water mixture which is substantially free from reduction in peroxodisulfuric acid amount (concentration) can act on the resist present on the front surface of the wafer W. Thus, the resist can be more advantageously removed from the front surface of the wafer W.

Figure 7:
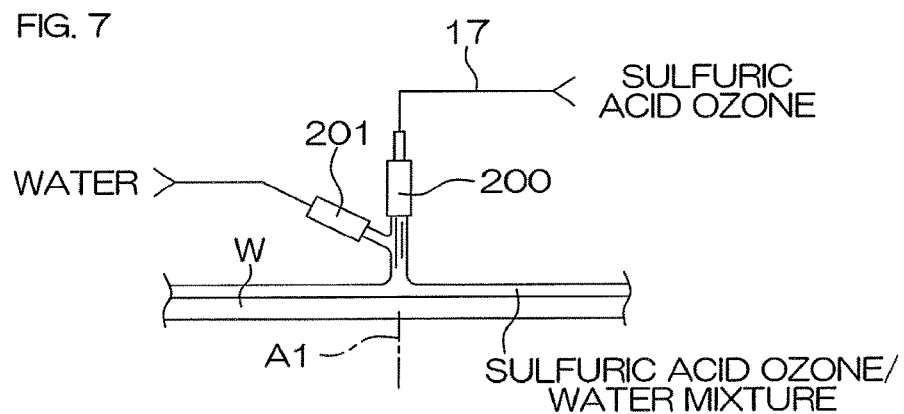
FIG. 7 is a diagram schematically showing the construction of a substrate treatment apparatus according to further another embodiment of the present invention.
Figure 8:
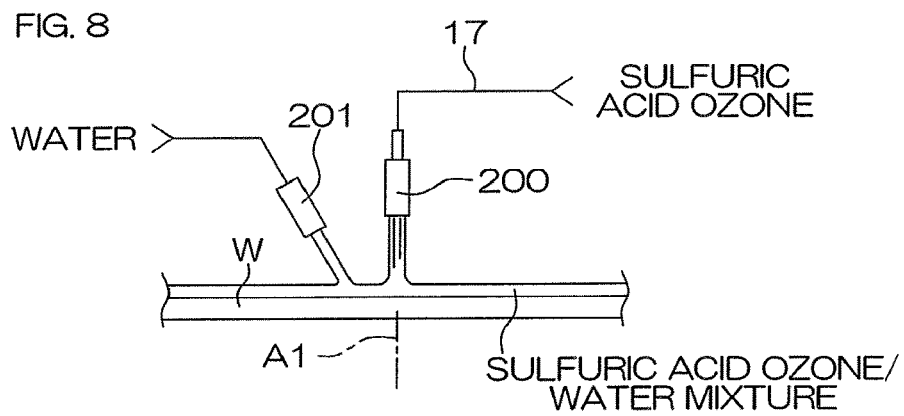
FIG. 8 is a diagram schematically showing the construction of a substrate treatment apparatus according to still another embodiment of the present invention.

Further, as shown in FIGS. 7 and 8, the substrate treatment apparatus may be configured so that the water is mixed with sulfuric acid ozone just spouted from a sulfuric acid ozone nozzle 200. In this case, the water mixing portion 15 is obviated, and the sulfuric acid ozone nozzle 200 is provided at the distal end of the sulfuric acid ozone supply pipe 17. The sulfuric acid ozone nozzle 200 is a straight nozzle adapted to spout the sulfuric acid ozone toward the front surface of the wafer W.

As shown in FIG. 7, for example, the substrate treatment apparatus may be configured so that the water is spouted (sprayed) from a water nozzle 201 toward the sulfuric acid ozone spouted from the sulfuric acid ozone nozzle 200 before reaching the wafer W. In this case, the sulfuric acid ozone and the water are mixed together above the wafer W, and the resulting sulfuric acid ozone/water mixture is supplied to the front surface of the wafer W. Thus, the sulfuric acid ozone having a higher ozone concentration can act on the resist present on the front surface of the wafer W.

Further, as shown in FIG. 8, the substrate treatment apparatus may be configured so that the water (for the dilution) is spouted (sprayed) from the water nozzle 201 toward the front surface of the wafer W. In this case, the sulfuric acid ozone spouted from the sulfuric acid ozone nozzle 200 and the water spouted from the water nozzle 201 are mixed together on the front surface of the wafer W. Thus, the sulfuric acid ozone having a higher ozone concentration can act on the resist present on the front surface of the wafer W. It is needless to say that the mixing of the sulfuric acid ozone and the water on the front surface of the wafer W as shown in FIG. 8 is one exemplary method of supplying the sulfuric acid ozone/water mixture to the front surface of the wafer W.

In the embodiment shown in FIGS. 1 to 3, the substrate treatment apparatus is adapted to prepare the sulfuric acid ozone by the mixing of the ozone gas in the ozone gas mixing portion 25 by way of example but, instead, may be arranged so that a bubbler (not shown) is provided on the bottom of the sulfuric acid ozone tank 22 and the sulfuric acid retained in the sulfuric acid ozone tank 22 is bubbled with the ozone gas supplied to the bubbler through an ozone gas supply valve (not shown) to prepare the sulfuric acid ozone.

The recycling device (not shown) may be provided within the substrate treatment apparatus 1. In other words, a mechanism for the recovery and the recycling of the sulfuric acid ozone (recovery/recycling mechanism) may be provided within the substrate treatment apparatus 1. In this case, a treatment process for the recovery and the reuse (recycling) of the sulfuric acid ozone can be performed in the substrate treatment apparatus 1 without the use of any device provided outside the substrate treatment apparatus 1.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2012-176233 filed in the Japan Patent Office on Aug. 8, 2012, the disclosure of which is incorporated herein by reference in its entirety.

What is claimed is:

1. A substrate treatment method to be used for removing a resist from a substrate front surface, the method comprising:

a substrate holding step of holding the substrate horizontally while opposing the front surface of the substrate to a discharge port of a mixture nozzle;

a sulfuric acid circulation step of circulating sulfuric acid in a circulation passage;

a sulfuric acid ozone generating step of supplying ozone gas the circulation passage to dissolve ozone gas in the circulating sulfuric acid to generate sulfuric acid ozone;

a sulfuric acid ozone heating and circulation step of heating the sulfuric acid ozone while circulating the sulfuric acid ozone in the circulation passage so as to keep the sulfuric acid ozone at a predetermined first temperature;

a sulfuric acid ozone/water mixture generating step of mixing the sulfuric acid ozone adjusted to the first temperature in the sulfuric acid ozone heating and circulation step and a liquid water to generate a sulfuric acid ozone/water mixture having a second temperature higher than the first temperature with the reaction heat generated by mixing the sulfuric acid ozone and the liquid water in a mixed liquid supply pipe which is branched from the circulation passage and has a downstream end connected to a mixture nozzle which is not connected to the circulation passage; and a resist removal step of removing the resist from the substrate front surface by discharging the sulfuric acid ozone/water mixture generated in the sulfuric acid ozone/water mixture generating step from the discharge port of the mixture nozzle to the substrate front surface, wherein the first and second temperatures are set such that the solubility of ozone gas in sulfuric acid adjusted to the first temperature is higher than the solubility of ozone gas in sulfuric acid adjusted to the second temperature.

2. The substrate treatment method according to claim 1, wherein the temperature of the sulfuric acid ozone which is mixed with the liquid water in the sulfuric acid ozone/water mixture generating step is lower than 100° C.

3. The substrate treatment method according to claim 1, wherein the temperature of the sulfuric acid ozone/water mixture generated in the sulfuric acid ozone generation step is not lower than 140° C.

4. The substrate treatment method according to claim 1, wherein the ozone gas concentration of the sulfuric acid ozone which is mixed with the liquid water in the sulfuric acid ozone generating step is 55 to 65 ppm.

5. The substrate treatment method according to claim 1, wherein the sulfuric acid ozone heating and circulation step includes a step of adjusting a temperature by circulating the sulfuric acid ozone generated in the sulfuric acid ozone generating step in the circulation passage in which a heater is disposed.

* * * * *